(12) United States Patent
Chen

(10) Patent No.: US 8,081,451 B1
(45) Date of Patent: Dec. 20, 2011

(54) PORT LOCKING DEVICE

(75) Inventor: Song-Ya Chen, Shenzhen (CN)

(73) Assignees: Fu Tai Hua Industry (Shenzhen) Co., Ltd., ShenZhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 0 days.

(21) Appl. No.: 12/915,051

(22) Filed: Oct. 29, 2010

(30) Foreign Application Priority Data

Jul. 30, 2010 (CN) .......................... 2010 1 0241317

(51) Int. Cl.
*H05K 5/00* (2006.01)
*H05K 7/00* (2006.01)
(52) U.S. Cl. .......... 361/679.57; 361/679.45; 361/679.58
(58) Field of Classification Search ............. 361/679.45, 361/679.57, 679.58, 679.6
See application file for complete search history.

(56) References Cited

U.S. PATENT DOCUMENTS

| | | | |
|---|---|---|---|
| 6,529,371 B1 * | 3/2003 | Laio | 361/679.6 |
| 7,583,495 B2 * | 9/2009 | Carnevali | 361/679.29 |
| 7,894,186 B2 * | 2/2011 | Farrow et al. | 361/679.57 |
| 2005/0207108 A1 * | 9/2005 | Chen | 361/685 |
| 2009/0249495 A1 * | 10/2009 | Farrow et al. | 726/34 |

* cited by examiner

*Primary Examiner* — Anthony Haughton
(74) *Attorney, Agent, or Firm* — Altis Law Group, Inc.

(57) ABSTRACT

A port locking device is fixed to an electronic device. The port locking device comprises a keyhole and a key. A port and a processing unit are connected by a magnetic metal. To lock a port of the electronic device, the key is received in the keyhole. After the key is pressed downwards to a plane on which a port switch of the keyhole is positioned, the key magnetizes a first magnetic object in the keyhole. As the key is rotated, the first magnetic object magnetizes the magnetic metal to cease connection between the port and the processing unit of the electronic device, and the port is locked.

10 Claims, 7 Drawing Sheets

PORT LOCKING DEVICE

BACKGROUND

1. Technical Field

The present disclosure relates to a port locking device.

2. Description of Related Art

For exchanging data with external devices, ports, such as USB, IEEE 1394, and others, are provided for electronic devices. However, the ports also present security problems, such as, for example, providing unauthorized access to confidential data, and exposure to virus or other harmful programs. While ports can be locked through applications which require a password for identification, however, providing the password can be inconvenient.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
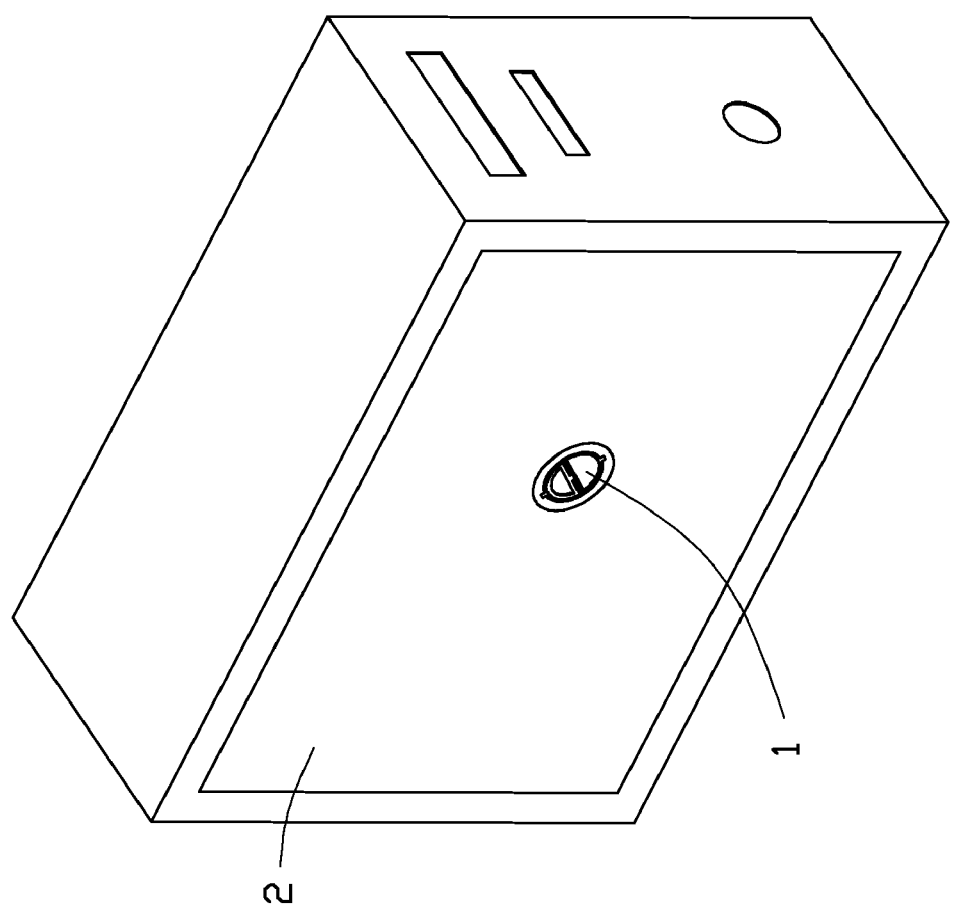
FIG. 1 is an isometric view of an electronic device with a port locking device in accordance with an exemplary embodiment.

FIG. 1 is an isometric view of an electronic device with a port locking device 1 in accordance with an exemplary embodiment. The port locking device 1 is fixed to a housing 2 of the electronic device. In this exemplary embodiment, the electronic device is a computer host.

Figure 2:
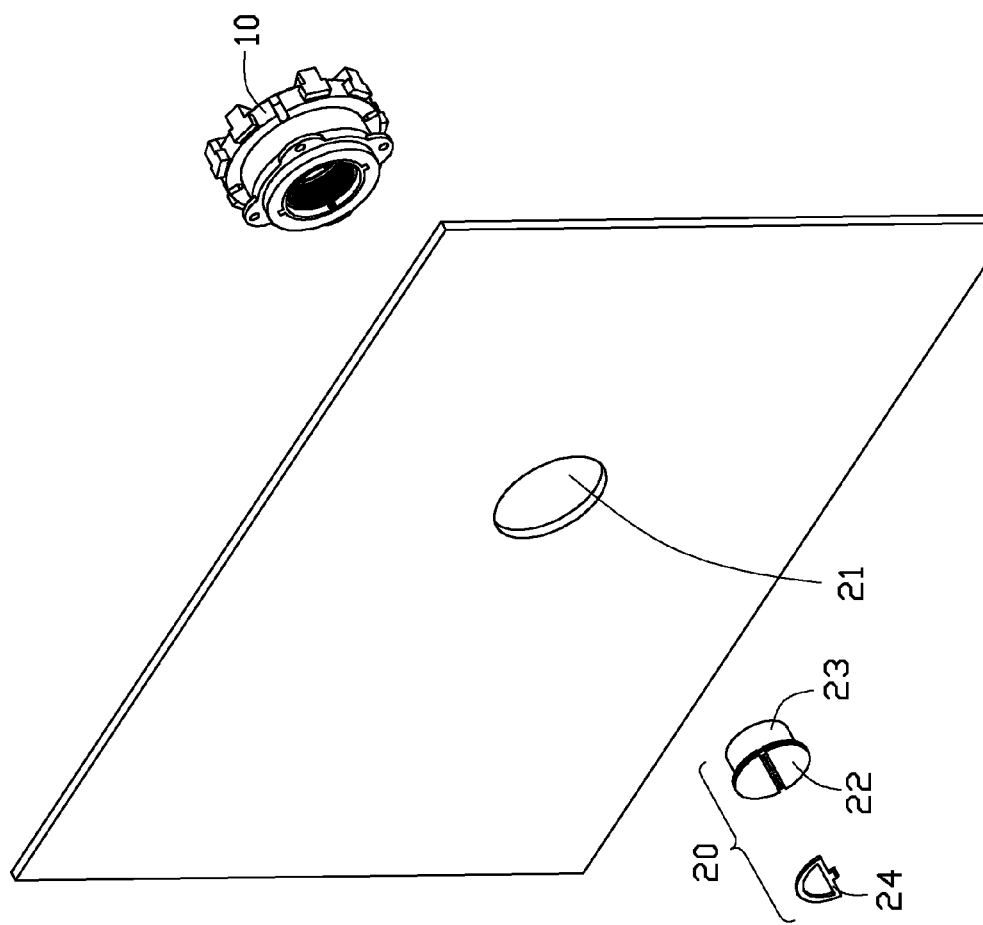
FIG. 2 is an isometric, exploded view of a key of the port locking device of FIG. 1.

As shown in FIG. 2, the port locking device 1 includes a keyhole 10 and a key 20. The keyhole 10 is fixed to the inner surface of the housing 2. A hole 21 is defined on the housing 2 and matches the keyhole 10. The key 20 is received in the keyhole 10 through the hole 21 to lock the ports (not shown) of the electronic device.

Figure 3:
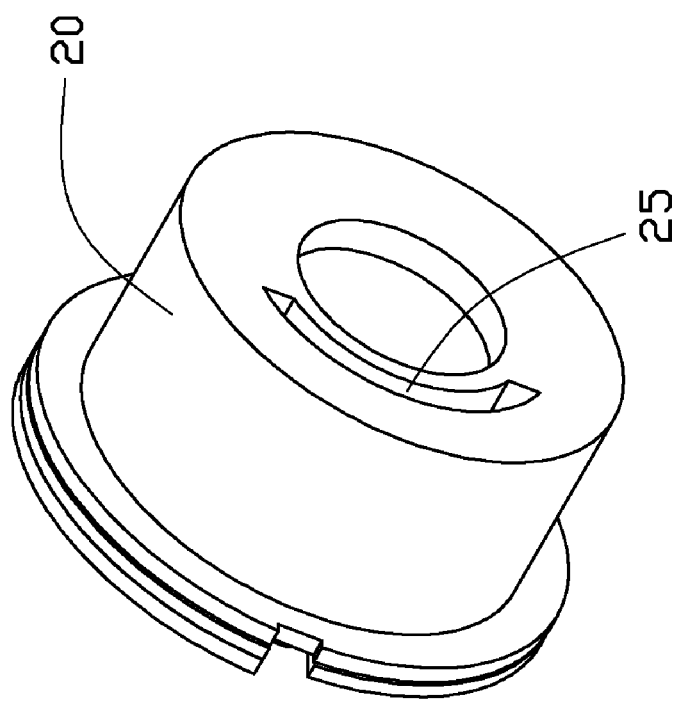
FIG. 3 is an isometric view of a key of the port locking device of FIG. 1.

The key 20 includes a stopper 22, a post 23, and a handle 24. The post 23 is connected to one surface of the stopper 22. The handle 24 is fixed to the other surface of the stopper 22 for controlling the key 20. As shown in FIG. 3, the end of the post 23 includes a groove 25.

Figure 4:
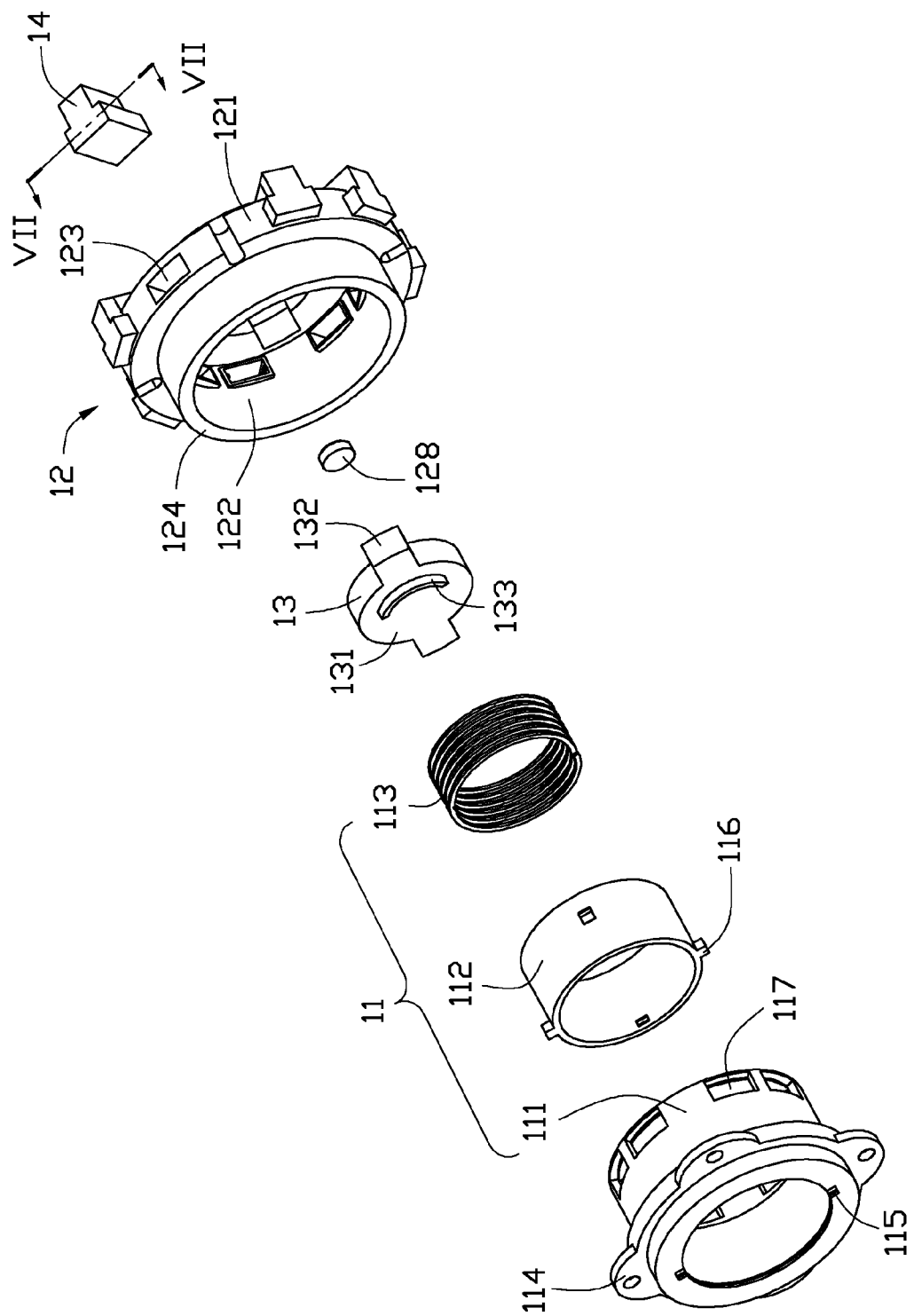
FIG. 4 is an exploded view of a keyhole of the port locking device of FIG. 1.
Figure 5:
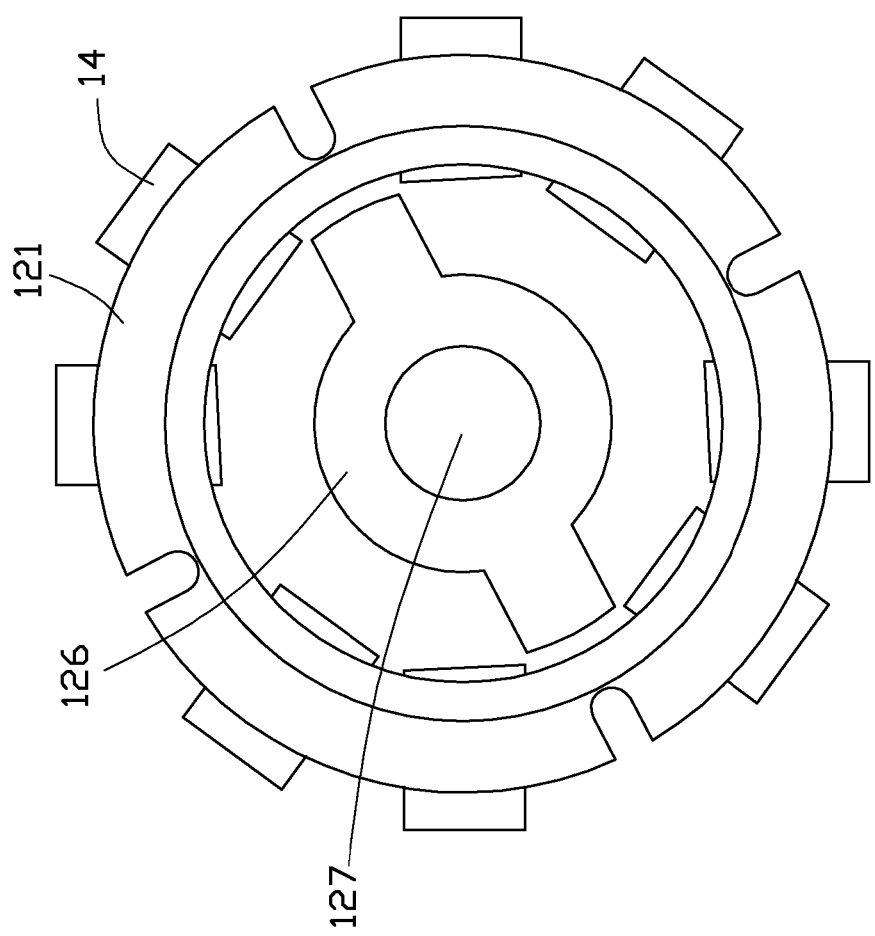
FIG. 5 is a plan view of a port connector of the keyhole of FIG. 4.

As shown in FIG. 4, the keyhole 10 includes a supporter 11, a port connector 12, a first magnetic object 13, and at least one port switch 14. The supporter 11 includes a support stand 111, a fixed element 112, and an elastic element 113. The support stand 111 is a hollow cylinder. One end of the support stand 111 defines a connector 114. The keyhole 10 is fixed to the housing 2 through the connector 114. The fixed element 112 is a hollow cylinder. The elastic element 113 is received in the fixed element 112 and one end of the elastic element 112 connects to the elastic element 113. In this embodiment, the fixed element 112 defines two hooks 116. The support stand 111 includes two hook portions 115 which match the two hooks 116 of the fixed element 112. The fixed element 112 is connected to the support stand 111 by the hooks 16 received in the hook portions 115. At least one second through groove 117 is defined at the wall of the support stand 111 for connecting the port connector 12, as follows.

The port connector 12 includes a main body 121, a first recess 122, and at least one first through groove 123. The first recess 122 is defined at the middle of the main body 121 and forms an annular wall 124 with the main body 121. The first through groove 123 is defined at the annular wall 124. The first magnetic object 13 is received in the first recess 122. In this exemplary embodiment, to limit movement of the first magnetic object 13, a second recess 126 is defined at the bottom of the first recess 122 for receiving the first magnetic object 13. The second recess 126 matches the first magnetic object 13. A third recess 127 is defined at the bottom of the second recess 126. A second magnetic object 128 is received in the third recess 127 to magnetize the first magnetic object 13, and thus further prevent movement of the first magnetic object 13.

The top surface of the first magnetic object 13 includes a main body 131 and at least one lock head 132. A protrusion 133 which matches the groove 25 of the post 23 is defined at the main body 131. The lock head 132 protrudes from the main body 131.

Figure 6:
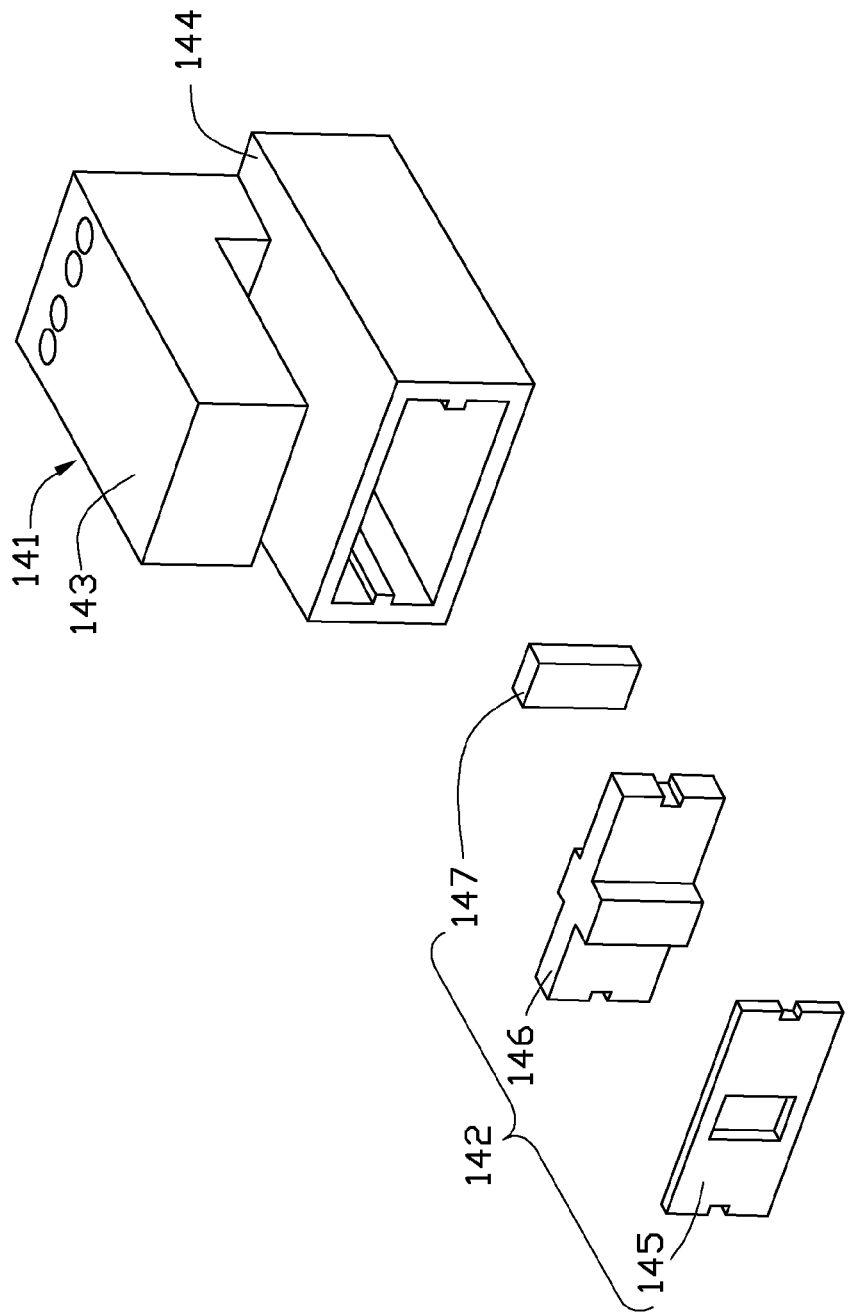
FIG. 6 is an exploded view of a port switch of the keyhole of FIG. 4.

As shown in FIG. 6, the port switch 14 includes a shell 141 and a switch part 142. The shell 141 is U-shaped and includes a first arm 143 and a second arm 144. The first arm 143 contacts the bottom of the main body 121. The second arm 144 passes through the first through groove 123 of the port connector 12 and the second through groove 117 of the support stand 111. Thus, the port connector 12 and the support stand 111 are connected by the port switch 14.

Figure 7:
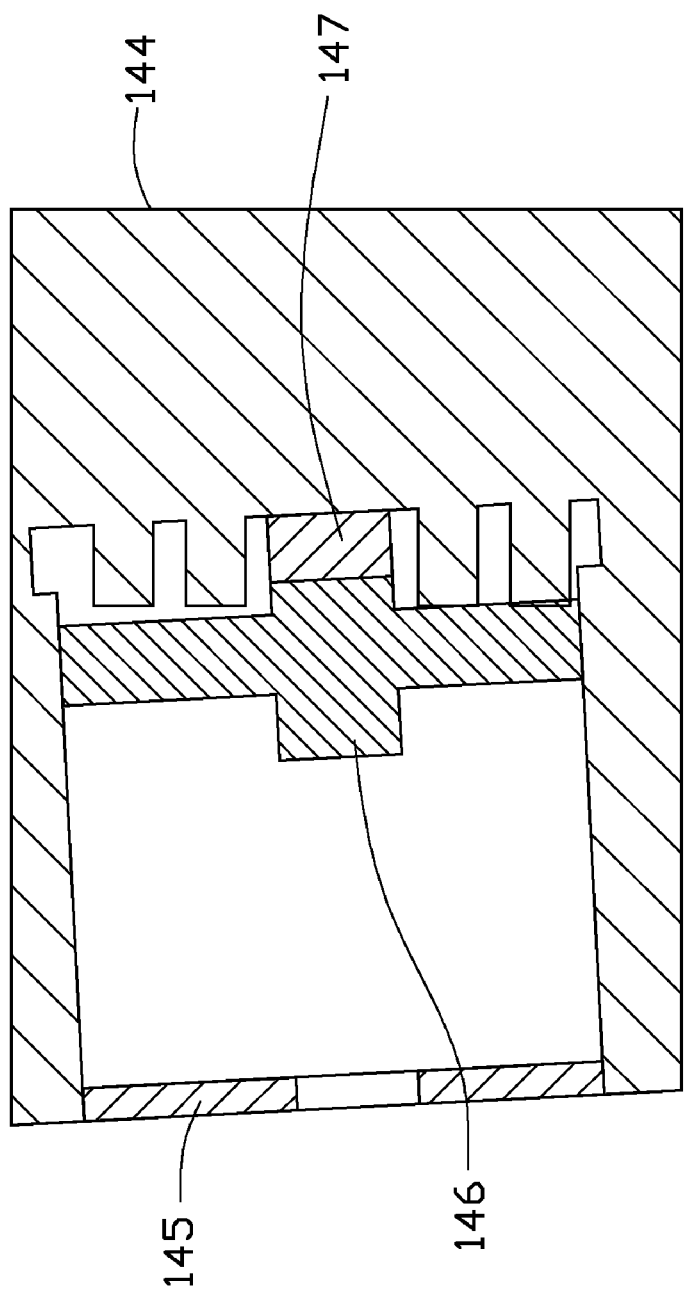
FIG. 7 is a cross-sectional view of the port switch of the keyhole of FIG. 4, taken along the line VII-VII of FIG. 6.

As shown in FIG. 7, the switch part 142 is received in the second arm 144 of the shell 141. The switch part 142 includes a stopper 145, a magnetic metal 146, and a third magnetic object 147. The magnetic metal 146 and the third magnetic object 147 magnetize each other, and are positioned at the closed end of the shell 141. The stopper 145 is fixed at the open end of the shell 141. When the port is not locked, the magnetic object 147 connects the port and a processing unit (not shown) of the electronic device.

When locking the port of the electronic device, the post 23 of the key 20 is received in the elastic element 113 to bias the stopper 22 on the elastic element 113. Downward pressure on the key 20 on the same plane as the port switch 14 deforms the elastic element 113 and the post 23 magnetizes the first magnetic object 13 in the port connector 12, and the groove 25 defined in the end of the post 23 matches the protrusion 131 of the first magnetic object 13. As the key 20 is rotated through the handle 24 the lock head 132 of the first magnetic object 13 rotates to face the port switch 14. The magnetic force between the first magnetic object 13 and the magnetic metal 146 exceeds that between the third magnetic object 147 and the magnetic metal 146, whereby the magnetic metal 146 is magnetized to and stopped by the stopper 145. The connection between the port and the processing unit is cut off, and the port is locked. In this embodiment, the stopper 145 is magnetic metal, such as iron.

When unlocking the port of the electronic device, the key 20 rotating through the handle 24 rotates the first magnetic object 13 away form the port switch 14, the magnetic metal 146 is magnetized by the third magnetic object 147 in the original position, and the port and the processing unit of the electronic device are connected by the magnetic metal 146 again. The port is unlocked, and withdrawal of the key 20 is from the keyhole 10 returns the first magnetic object 13 to the port connector 12.

Although, the present disclosure has been specifically described on the basis of preferred embodiments, the disclosure is not to be construed as being limited thereto. Various changes or modifications may be made to the embodiment without departing from the scope and spirit of the disclosure.

What is claimed is:

1. A port locking device, for being fixed to an electronic device, the electronic device comprising at least one port and a processing unit, the port locking device comprising a keyhole and a key;

the keyhole comprising:
a supporter comprising a support stand and an elastic element, the support stand being connected to the electronic device, one end of the elastic element being fixed to the support stand;
a port connector comprising a main body and a first recess, the first recess and the main body forming an annular wall;
a first magnetic object being placed to the first recess; and
at least one port switch being connected to the annular wall, comprising at least one switch part, each of the at least one switch part further comprising a magnetic metal, when the port of the electronic device is unlocked, the at least one port switch being not in the same plane with the first magnetic object, the at least one magnetic metal connecting at least one port and the processing unit of the electronic device; and the key comprising:
a first stopper and a post, the post is magnetic;
when locking the port of the electronic device, the post of the key being received in the elastic element to make the stopper resist the elastic element, after the key being pressed downwards to a same plane which the port switch positions, the elastic element being deformed and the post magnetizing the first magnetic object placed in the port connector, the key being rotated to make the first magnetic object magnetize the magnetic metal to cut off the connection between the port and the processing unit of the electronic device, thus the port being locked.

2. The port locking device as described in claim 1, wherein the supporter further comprises a fixed element, the fixed element is connected to the support stand, the elastic element is received in the fixed element and one end of the elastic element connects to the elastic element.

3. The port locking device as described in claim 2, wherein the fixed element defines two hooks, the support stand includes two hook portions which matches the two hooks of the fixed element, and the fixed element is connected to the support stand through the match between the hooks and the hook portions.

4. The port locking device as described in claim 1, wherein a second recess is defined at the bottom of the first recess for receiving the first magnetic object, the second recess matches the first magnetic object.

5. The port locking device as described in claim 4, wherein a third recess is defined at the bottom of the second recess, a second magnetic object is received in the third recess to magnetize the first magnetic object, and thus prevents movement of the first magnetic object.

6. The port locking device as described in claim 4, wherein at least one first through groove is defined at the annular wall, and at least one second through groove is defined at the wall of the support stand, the port switch passes through the at lease one first through groove and the at least one second through groove to connect the port connector to the supporter.

7. The port locking device as described in claim 6, wherein the port switch further comprises a shell, the shell is U-shaped and includes a first arm and a second arm, the first arm contacts the bottom of the bottom of the main body, the second arm passes through the first through groove of the port connector and the second through groove of the support stand, thus, the port connector and the support stand are connected by the port switch.

8. The port locking device as described in claim 7, wherein the switch part is received in the second arm of the shell and further comprises a stopper and a third magnetic object, the magnetic metal and the third magnetic object magnetize each other and positions at the closed end of the shell, the stopper is fixed at the open end of the shell.

9. The port locking device as described in claim 1, wherein the key further comprises a handle, the handle is fixed to the first stopper.

10. The port locking device as described in claim 1, wherein the end of the post of the key comprises a groove, a protrusion which matches the groove of the post is defined at the first magnetic object, when the first magnetic object is magnetized by the post of the key, the groove of the post matches the protrusion of the first magnetic object.

\* \* \* \* \*